United States Patent [19]

Mills

[11] Patent Number: 4,970,511

[45] Date of Patent: Nov. 13, 1990

[54] METHOD AND APPARATUS FOR N/(N-X) RESOLVER ENCODER

[75] Inventor: Gerlad A. Mills, Maumelle, Ark.

[73] Assignee: Bei Electronics, Inc., San Francisco, Calif.

[21] Appl. No.: 445,198

[22] Filed: Dec. 4, 1989

[51] Int. Cl.⁵ .............................................. H03M 1/24
[52] U.S. Cl. ................................... 341/13; 250/231.16
[58] Field of Search ...................... 341/13, 1, 9, 10, 11; 324/175; 250/231 SE, 578

[56] References Cited

U.S. PATENT DOCUMENTS

| | | | |
|---|---|---|---|
| 3,534,360 | 12/1966 | Hafle | 341/9 |
| 4,335,306 | 6/1982 | Gort et al. | 250/231 SE |
| 4,443,788 | 4/1984 | Breslow | 341/9 |
| 4,465,928 | 8/1984 | Breslow | 250/231 SE |
| 4,621,256 | 11/1986 | Rusk | 341/3 |
| 4,654,636 | 3/1987 | Rusk | 341/13 |

*Primary Examiner*—William M. Shoop, Jr.
*Assistant Examiner*—Brian K. Young
*Attorney, Agent, or Firm*—Limbach, Limbach & Sutton

[57] ABSTRACT

An apparatus and method are disclosed for indicating the angular position of an object relative to a reference position in which a plurality of different tracks of indicia are positioned on indicia-supporting media that is adapted for movement with the object. High resolution position words are assembled by merging position information resolved from a plurality of different tracks of indica. The position information is resolved by way of sine wave synthesis in which position information from a pair of tracks having different resolutions is used to generate position information of an intermediate resolution. This intermediate position information is merged with position information from the higher resolution track of the two tracks. The position information from each of the different tracks is merged by comparing several of the most significant bits of the position information from several of the selected tracks with a corresponding number of least significant bits of the position information from others of the selected tracks. Position information of the selected tracks is then corrected as a function of the comparison, and the synchronized position information is combined to form position words indicative of the position of the object relative to the reference position. These position words have a resolution greater than that available by reading the plurality of different tracks of indicia directly.

9 Claims, 7 Drawing Sheets

17-BIT WORD

| POS. WORDS | WEIGHT: | $2^{16}$ | $2^{15}$ | $2^{14}$ | $2^{13}$ | $2^{12}$ | $2^{11}$ | $2^{10}$ | $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|---|---|---|---|---|---|---|---|---|
| COARSE BITS: (4-TRACK, DIRECT-READ) | | $C_1$ (MSB) | $C_2$ | $C_3$ | $C_4$ (LSB) | | | | | | | | | | | | | |
| INTERMEDIATE BITS: (N−X) CYCLES/REV. | | | | | | $I_1$ (MSB) | $I_2$ | $I_3$ | $I_4$ | $I_5$ | $I_6$ | $I_7$ | $I_8$ | $I_9$ | $I_{10}$ (LSB) | | | |
| FINE BITS: N CYCLES/REV. | | | | | | | | | | | | | | | | $F_1$ (MSB) | $F_2$ | $F_3$ | $F_4$ | $F_5$ | $F_6$ | $F_7$ | $F_8$ | $F_9$ (LSB) |
| BIT POSITION: (OVERALL POS. WORD) | | $B_1$ | $B_2$ | $B_3$ | $B_4$ | $B_5$ | $B_6$ | $B_7$ | $B_8$ | $B_9$ | $B_{10}$ | $B_{11}$ | $B_{12}$ | $B_{13}$ | $B_{14}$ | $B_{15}$ | $B_{16}$ | $B_{17}$ |

| | | | | | | | | | | | | | | | | | | |
|---|---|---|---|---|---|---|---|---|---|---|---|---|---|---|---|---|---|---|
| MSB | $b_1$ | 0 | 0 | 0 | 0 | 0 | 0 | 0 | 0 | 1 | 1 | 1 | 1 | 1 | 1 | 1 | 1 | 0 |
| | $b_2$ | 0 | 0 | 0 | 0 | 1 | 1 | 1 | 1 | 0 | 0 | 0 | 0 | 1 | 1 | 1 | 1 | 0 |
| | $b_3$ | 0 | 0 | 1 | 1 | 0 | 0 | 1 | 1 | 0 | 0 | 1 | 1 | 0 | 0 | 1 | 1 | 0 |
| | $b_4$ | 0 | 1 | 0 | 1 | 0 | 1 | 0 | 1 | 0 | 1 | 0 | 1 | 0 | 1 | 0 | 1 | 0 |
| | $b_5$ | 0 | 0 | 0 | 0 | 0 | 0 | 0 | 0 | 0 | 0 | 0 | 0 | 0 | 0 | 0 | 0 | 0 |
| | $b_6$ | 0 | 0 | 0 | 0 | 0 | 0 | 0 | 0 | 0 | 0 | 0 | 0 | 0 | 0 | 0 | 0 | 0 |
| | $b_7$ | 0 | 0 | 0 | 0 | 0 | 0 | 0 | 0 | 0 | 0 | 0 | 0 | 0 | 0 | 0 | 0 | 0 |
| | $b_8$ | 0 | 0 | 0 | 0 | 0 | 0 | 0 | 0 | 0 | 0 | 0 | 0 | 0 | 0 | 0 | 0 | 0 |
| | $b_9$ | 0 | 0 | 0 | 0 | 0 | 0 | 0 | 0 | 0 | 0 | 0 | 0 | 0 | 0 | 0 | 0 | 0 |
| LSB | $b_{10}$ | 0 | 0 | 0 | 0 | 0 | 0 | 0 | 0 | 0 | 0 | 0 | 0 | 0 | 0 | 0 | 0 | 0 |

*FIG. 7A*

| | | | | | | | | | | | | | | | | |
|---|---|---|---|---|---|---|---|---|---|---|---|---|---|---|---|---|
| $b_1$ | 0 | 0 | 0 | 0 | 0 | 0 | 0 | 0 | 0 | 0 | 0 | 0 | 0 | 0 | 0 | 0 |
| $b_2$ | 0 | 0 | 0 | 0 | 0 | 0 | 0 | 0 | 0 | 0 | 0 | 0 | 0 | 0 | 0 | 1 |
| $b_3$ | 0 | 0 | 0 | 0 | 0 | 0 | 1 | 1 | 1 | 1 | 1 | 1 | 1 | 1 | 1 | 0 |
| $b_4$ | 0 | 0 | 0 | 0 | 1 | 1 | 1 | 1 | 0 | 0 | 0 | 0 | 1 | 1 | 1 | 0 |
| $b_5$ | 0 | 0 | 1 | 1 | 0 | 0 | 1 | 1 | 0 | 0 | 1 | 1 | 0 | 0 | 1 | 0 |
| $b_6$ | 0 | 1 | 0 | 1 | 0 | 1 | 0 | 1 | 0 | 1 | 0 | 1 | 0 | 1 | 0 | 0 |
| $b_7$ | 0 | 0 | 0 | 0 | 0 | 0 | 0 | 0 | 0 | 0 | 0 | 0 | 0 | 0 | 0 | 0 |
| $b_8$ | 0 | 0 | 0 | 0 | 0 | 0 | 0 | 0 | 0 | 0 | 0 | 0 | 0 | 0 | 0 | 0 |
| $b_9$ | 0 | 0 | 0 | | 0 | | | 0 | | 0 | | 0 | | 0 | | 0 |
| $b_{10}$ | 0 | 0 | 0 | | 0 | | | 0 | | 0 | | 0 | | 0 | | 0 |

METHOD AND APPARATUS FOR N/(N-X) RESOLVER ENCODER

TECHNICAL FIELD

The present invention is generally directed to position indicating methods and apparatus, and more particularly to an improved resolver method and apparatus in which position words from different sinusoidal tracks that cover different resolutions are used to from an intermediate set of position words which are thereafter merged to form higher resolution position words.

BACKGROUND ART

In the area of position encoding, and more specifically in the absolute encoder art, high resolution position encoders typically employ a multiplicity of separate tracks which are read directly to provide position words. Alternatively, there is used a combination of direct read track and an additional track. The additional track provides the least significant bits of the output position word. The latter approach is illustrated in U.S. Pat. No. 3,534,360 to Hafle. In such an approach the least significant bit of the position words from the direct read tracks is synchronized with the most significant bit of the resolved word using an XOR function.

The disadvantages of the above approaches include: (1) the greater number of direct read tracks, the higher the physical area required to support such tracks, and (2) the merging of resolved words with direct-read words is limited in the amount of variation which can be tolerated between the resolved words and the directly read words.

Other prior approaches have extended the merging concept disclosed in the above referenced patent to Hafle, and merged position words synthesized from different tracks of overlapping resolution. This is reflected in Model Mil-158 developed by the inventor of the present application and sold by BEI Motion Systems, Inc., the assignee of the present application.

More specifically, several tracks having overlapping resolution are used to synthesize position words of different but overlapping resolution. The tracks are used to generate triangular wave signals. The amplitude from each signal is converted into a binary position word using analog to digital converters. These position words are then merged together with the overlapping bits between position words being used to correct the least significant bit of the next coarser resolution position words. The relative resolution between tracks is selected so that an overlap of at least two bits between position words is provided.

In this manner, high resolution position words can be assembled by merging position information resolved from a plurality of different tracks of indica. The different tracks of indicia each provide position information having different, but overlapping, degrees of resolution so that when position information from each of the tracks are merged or synchronized, a position word of higher resolution is obtained.

SUMMARY OF THE INVENTION

These and other problems and disadvantages of previous position encoding methods and apparatus are overcome by the present invention of an apparatus for indicating the angular position of an object relative to a reference position, where the apparatus is of the type having indicia-supporting media positioned for movement with the object and employs direct read and sinusoidal tracks of differing resolution to provide high resolution position words.

As used in this specification, it is to be understood that the terms "position information" and "position word" refer to instantaneous position. As the position of the object being monitored changes, the "position information" may change and hence the "position word" may change.

In accordance with the present invention, the position information which is resolved from the various tracks is obtained by way of sine wave synthesis, in which position information from two tracks having different resolutions is used to generate position information of an intermediate resolution. This intermediate position information is merged with position information from the higher resolution track of the two tracks. In turn, the resulting merged higher-resolution-position-word can be merged with position information from other tracks such as direct read tracks.

It is therefore an object of the present invention to provide a position encoding apparatus in which position information is synthesized from tracks of indicia which provide sinusoidally varying waveforms.

It is another object of the present invention to provide a position encoding apparatus in which position information is synthesized from at least a pair of tracks of indicia which provides sinusoidally varying waveforms and further wherein position information from the sinusoidally varying waveforms are utilized to form position words of intermediate resolution.

These and other features and advantages of the present invention will be more readily understood upon consideration of the following detailed description and accompanying drawings.

DETAILED DESCRIPTION OF THE INVENTION

Figure 1:
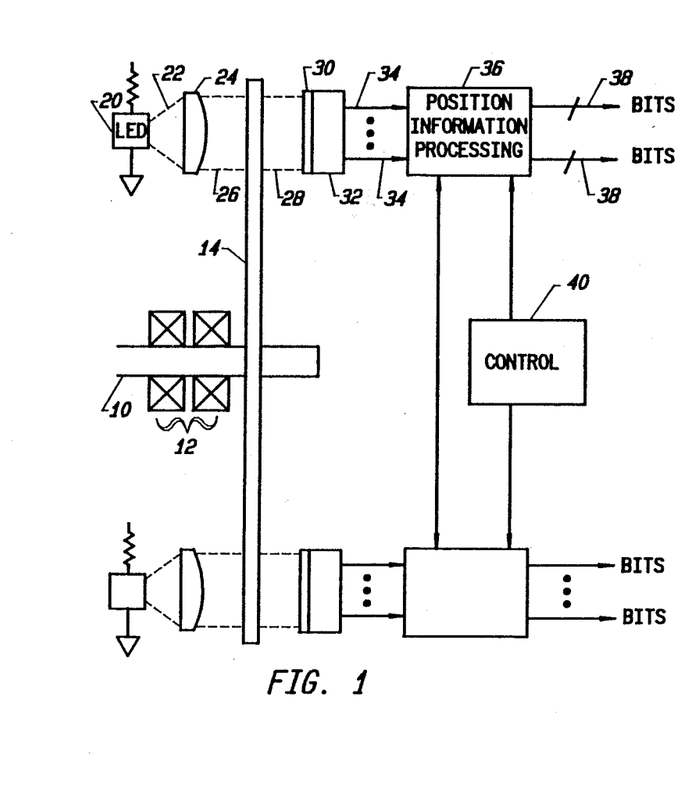
FIG. 1 is a generalized, simplified block diagram of a position encoder in accordance with the present invention.
Figure 2:
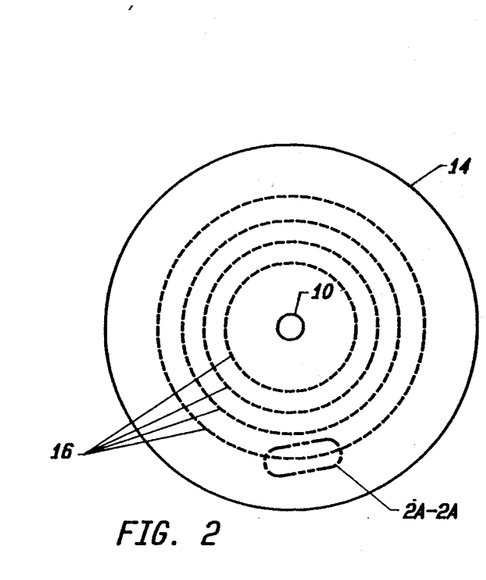
FIG. 2 illustrates the positioning of tracks of indicia on a code disk used in the apparatus of FIG. 1.
Figure 2A:
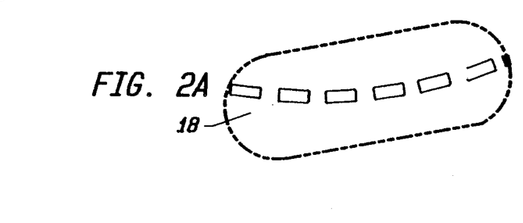

Referring to FIG. 1, a typical application of the present invention is shown in which position information indicative of the angular position of object shaft 10 is provided. Object shaft 10 is supported by bearings 12. Code disk 14 is mounted on object shaft 10 for rotation therewith. As shown in FIG. 2, tracks 16 of indicia 18 are positioned concentrically on code disk 14. Preferably, code disk 14 is transparent and indicia 18 opaque so that the indicia will modulate the intensity of light passing through the region of the disk 14 at which the tracks 16 of indicia are positioned.

Returning to FIG. 1, a source of light, such as light emitting diode 20, is positioned on one side of the code disk 14 and provides a beam of light 22 which is collimated by lens 24. Lens 24 collimates light beam 26 or to the region of code disk 14 in which the tracks 16 of indicia 18 are found. As indicated above, the indicia 18 modulate the intensity of light passing through the code disk 14. The modulated light beam 28 then impinges upon a grating 30 which selectively masks the modulated light beam 28. In turn, the masked, modulated light beam (not shown) impinges upon photo detector 32 where the masked, modulated light beam is converted into an electrical signal.

It is to be understood that for each of the tracks 16 of indicia 18, there is provided a grating and a corresponding photo detector such that an electrical signal is produced for each of the different tracks 16 of indicia 18. These electrical signals represent the modulation of the light beam by the indicia. This is indicated by the multiplicity of lines 34 emerging from photodiode array 32 and entering position information processing block 36.

Position information processing block 36 synthesizes (or resolves) position information from the photodiode signals, merges or synchronizes such information, and provides a resulting high resolution position word on lines 38. In FIG. 1, the bits of the position word are indicated as being provided by a plurality of lines 38 to signify that different portions of the final high resolution position word originate from different tracks 16 on code disk 14.

Control circuit 40 performs timing and control functions.

A second indicia reading station is shown at the bottom of FIG. 1, it being understood that such station can be used for reading additional, or different tracks, and is not necessary to practice the present invention.

Direct-Read Absolute Encoders

As a matter of background, it is to be noted that the tracks of indicia utilized in the present invention are used differently than in a direct-read absolute encoder. More specifically, when a direct-read absolute encoder provides position words of N bits in length, such words are derived from N tracks of indicia. Each track contributes one bit to the position word. In the above-referenced patent to Hafle, a 19 bit word is provided 13 bits of which is derived from 13 direct-read tracks of indicia, and the remaining 6 bits of which are synthesized from an additional track of indicia. As indicated above, the most significant bit of the six synthesized bits has the same resolution as the least significant bit of the 13 bits of the direct-read word. This is used to synchronize the two sets of bits with one another.

In contrast, in accordance with the present invention, a 17 bit encoder can be provided by way of three sets of tracks of indicia: (1) set one—4 direct read tracks; (2) set two—N cycles per revolution sine/cosine track pair; and (3) set three—(N-X) cycles per revolution sine/cosine track pair. A comparable 17-bit direct-read encoder requires 17 tracks of indicia.

"Resolution" Defined

It is to be noted that high resolution in accordance with the present invention is achieved by combining position information from different tracks of indicia, where the resolution of the different tracks can be expressed in terms of a number of cycles per revolution of the code disk. More specifically, each sinusoidal track of indicia of the present invention is formed from a plurality of indicia. Within a particular track the indicia are identical. The tracks with the smallest number of indicia provide the lowest or coarsest resolution position information. The tracks with the highest number of indicia provide the highest or finest resolution.

The indicia are typically opaque sections interspersed with transparent sections, with one opaque section and an adjacent transparent section forming a cycle. As such, each indicia-cycle in a track has a resolution which corresponds to a fractional part of one revolution of the code disk. In other words, each indicia-cycle in a track corresponds to a particular angular displacement of the code disk.

One indicia-cycle of the lower resolution tracks corresponds to a greater angular displacement of the code disk than one indicia-of indicia cycle of the higher resolution tracks.

While in theory, high resolution position words should be resolvable from a single code track by employing high resolution amplitude decoding circuitry, in practice this is not easily achieved with the technology currently available. In the current state of the art, analog to digital converters of reasonable cost can provide words having 10-bit resolution. Analog to digital converters having higher levels of resolution increase in cost with each additional bit of resolution, may be too slow for the particular application, may consume substantially more power than is available for the circuitry, and may occupy more physical space than is allotted.

In accordance with the present invention, higher resolution is achieved without utilizing high resolution analog to digital converters or other detection circuitry having higher resolution. Instead, analog to digital conversion techniques are employed which have nominal resolution. However, these techniques are used to resolve information from tracks which provide different degrees of resolution of angular displacement per indicia-cycle. The position information from each of the tracks is then merged to form a position word having a substantially greater resolution than that available if the tracks of indicia were read directly.

Relative Resolution of the Tracks

Figure 3:
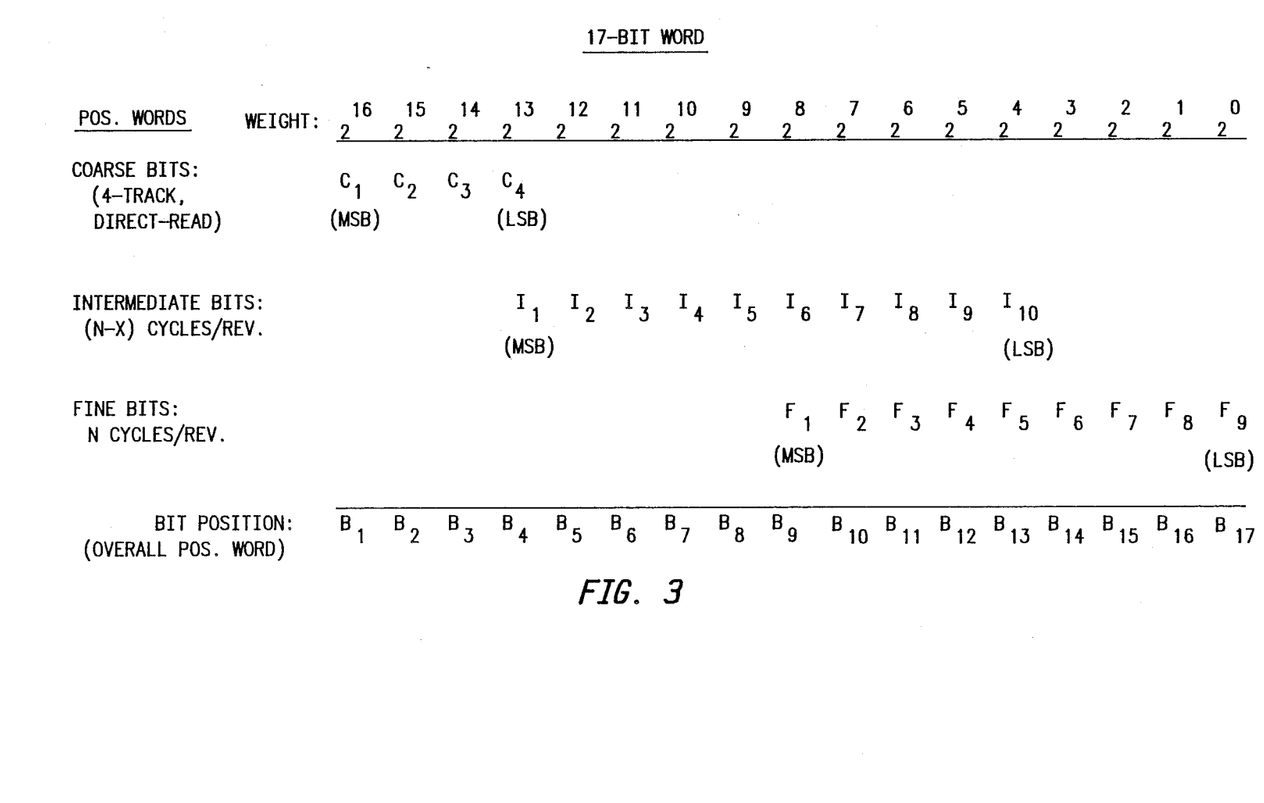
FIG. 3 is an illustrative example of the contribution to the overall position word made by information from the various tracks of an encoder in accordance with the present invention.

The above discussion will be more readily understood with reference with FIG. 3. The example shown in this figure provides a 17 bit position word; i.e., the least significant bit of the word corresponds to $360 \div 131,072$ degrees. In accordance with the present invention, three sets of tracks of indicia are used to achieve this. More specifically, a direct read set of tracks provides the Coarse Bits $C_1$ through $C_4$, and a resolution of sixteen position words per revolution. A track having N cycles per revolution provides a set of fine resolution bits $F_1$ through $F_9$. Finally, the N track and a (N-X) cycles per revolution track are compared with one another to provide a set of intermediate bits, $I_1$ through $I_{10}$.

In FIG. 3, the bits of position information from each of the tracks is shown according to the resolution they represent in the overall position word. The line in FIG. 3 labeled "weight" indicates the weight of each bit in the overall position word. For example, bits $C_1$ through $C_4$ have weights of $\beta^{16}$ down to $2^{13}$, respectively; bits $I_1$ through $I_{10}$ have a weight of $2^{13}$ down to $2^4$, respectively; and bits $F_1$ through $F_9$ have weights from $2^8$ down through $2^0$, respectively.

The convention which will be used in the following description, is that the bit of the overall position word having the highest or most significant weight will be referred to as bit 1, or $B_1$; and the bit with the lowest weight, or significance, will be referred to as bit 17, or $B_{17}$. This is also indicated in FIG. 3.

As can be seen from FIG. 3, there is a one bit overlap in resolution between the position information from the direct-read coarse tracks and the position information from the intermediate set of bits. Further, there is a five bit overlap in the position information between the intermediate bits and the fine bits. Such overlapping permits the toleration of a greater error in the relative physical positioning of the tracks to one another on the code disk.

More particularly, the accuracy of the position word is a function of the accuracy by which the various tracks are positioned with respect to one another. In practice, due to manufacturing and other tolerances, there will be some alignment errors between tracks. For example, particular position a transition will occur in a number of the tracks, such transition should occur simultaneously. However, due to manufacturing tolerances, there will be some slight variations from track to track as to when such transitions occur. Further, because position information is derived through a different channel for each track, there will be variations in response and propagation delay time through each channel which can result in a slipping of position information from one track relative to that of another.

Such slippage can be tolerated to a greater degree by increasing the amount of overlap in bit positions between words from the various different tracks. The words of position information from each track are synchronized using the words from the track of highest resolution as the reference. The tracks of higher resolution (corresponding to the lesser significant bits) are synchronized first and the tracks of lower resolution (most significant bits) are synchronized last.

Merging of Position Words

The overlap between words of different tracks is used to determine the degree by which the bits of common resolution for the tracks differ. The result of such comparison is used to correct all of the bits for the track having the lower resolution. Thus, in FIG. 3, bits $F_1$ through $F_1$ are compared to bits $I_6$ through $I_{10}$. The results of this comparison are used to correct the bits of the position information from the intermediate position words; i.e., $I_1$ through $I_{10}$. Bits $I_6$ through $I_{10}$ have the same resolution as bits $F_1$ through $F_5$; i.e., weight $2^8$ through $2^4$, respectively. The corrected position word from the intermediate bits is then used to correct the position word for the coarse tracks.

Figure 4:
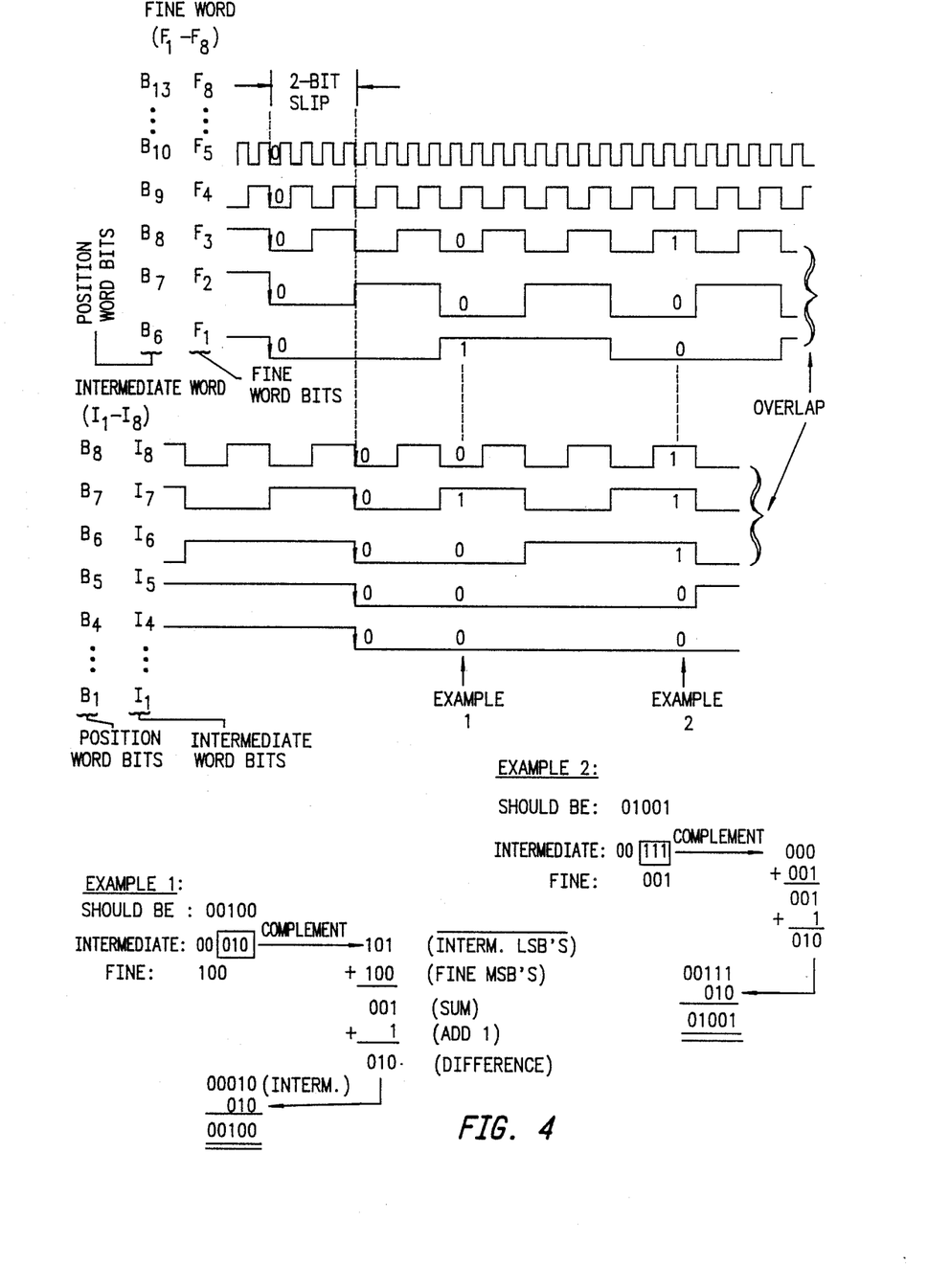
FIG. 4 is an illustrative example of the merging of position information from different tracks of indicia, having different resolutions, in accordance with the present invention.
Figure 5:
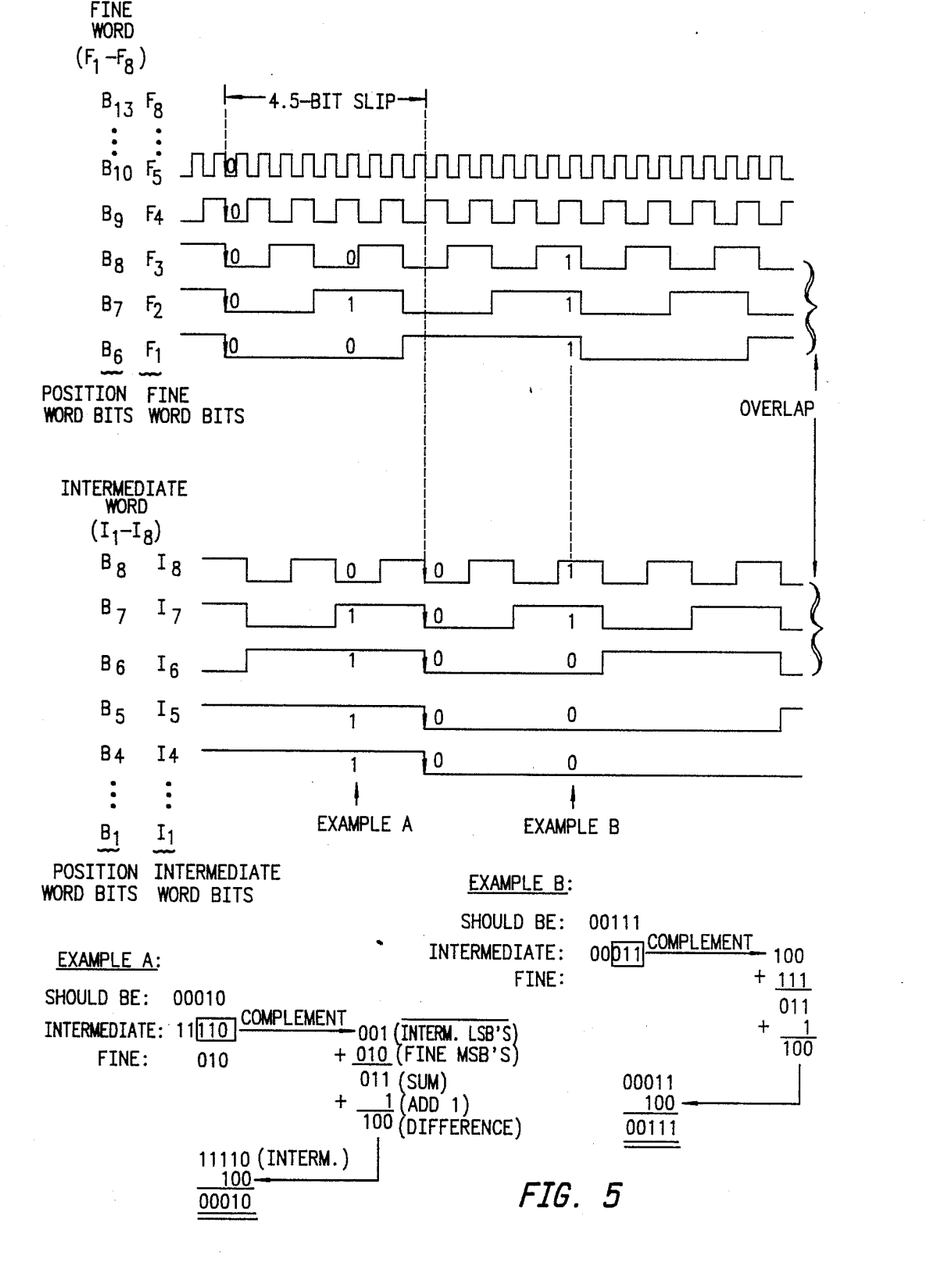
FIG. 5 is another illustrative example of the merging of position information from different tracks of indicia in accordance with the present invention.

FIGS. 4 and 5 illustrate by way of example the comparison and correction between two eight-bit words from different tracks where an overlap of three bits in resolution is used. It is to be understood that similar operations would be performed for greater or lesser amounts of overlap.

For purposes of the example, the word having the highest resolution is labeled "fine word" and the word having the lowest resolution is labeled "intermediate word". Bits from the intermediate word are labeled $I_1$ through $I_8$, from most to least significant, respectively, while bits from the fine word are labeled $F_1$ through $F_8$, from most significant to least significant, respectively. Also provided are the corresponding bit positions for the overall word. Thus, fire word bits $F_1$ through $F_8$ correspond to bit positions $B_6$ through $B_{13}$, respectively, while intermediate word bits $I_1$ through $I_8$ correspond to bit positions $B_1$ through $B_8$, respectively. The overlap between the fine word and the intermediate word occurs at $F_1$ through $F_3$ of the fine word, and $I_6$ through $I_8$ of the intermediate word.

Illustrated in FIG. 4 is an example in which there is a 2-bit slip between the fine word and the intermediate word. As can be seen from the figure, the amount of slip is measured according to the least significant bit of the overlap. As a reference point, the all zero state is shown for the intermediate word and the fine word. It can be seen that the zero state of the intermediate word is two transitions removed from the zero state of the fine word.

For purposes of this example, it is to be assumed that position information being merged progresses from left to right so that the waveforms at the left of the figure correspond to an early point in time while the waveforms to the right of the figure correspond to a later point in time.

FIG. 4 provides two examples of how the position information from the intermediate word is synchronized with the fine word position information. In accordance with the preferred embodiment of the present invention, for clock-wise revolution of the code disk, the overlap bits from the fine word are subtracted from the overlap bits of the intermediate word. The difference is then added to the intermediate word to obtain a corrected intermediate word.

With respect o example 1 of FIG. 4, there are three bits of overlap, with the fine bits of overlap being 100. The intermediate word is 00010. The difference between the intermediate word and the three bits of fine word is determined using 2's complement arithmetic. The difference is determined to be 010 and this difference is added to the full intermediate word, 00010, to obtain the corrected intermediate word of 00100.

Similarly, in Example 2, the overlap bits of the fine word are 001, and the intermediate word is 00111. The difference is determined to be 010. This difference is added to the intermediate word of 00111 to obtain the corrected intermediate word of 01001.

As a result of the above operations, the overlap bits of the intermediate word are corrected so that they are the same as the overlap bits of the fine word. Further, the correction is extended through the most significant bits of the intermediate word by any carry provided by the addition operation.

In FIG. 5, a 3-bit overlap is again used, however, a 4.5 bit slip is illustrated. In Example A, the 3-bits of fine word overlap are 010 and the intermediate word is 11110. The difference is determined to be 100 resulting in a corrected intermediate word of 00010.

In Example B, the 3-bits of fine word overlap are 111, and the intermediate word is 00011. The difference is determined to be 100 resulting in a corrected intermediate word of 00111.

Overlap and Correction Available

For a 3-bit overlap between intermediate and fine words, a slip of $2^n-1$ bits can be corrected. Thus, for a 3-bit overlap, up to 7 bits of slip can be tolerated. This corresponds to a correction in terms of angular position of $(2^N-1)/2^N$ multiplied by the angular resolution of the next most significant bit being corrected. More specifically, for the examples of FIG. 5, the next most significant bit being corrected is bit $B_5$. If bit $B_5$ has an angular resolution of 22.5 degrees, for example, the 3-bits of overlap shown in FIG. 6 will permit corrections of up to $\frac{7}{8} \times 22.5$ degrees of angular rotation.

The greater the amount of overlap, the greater the tolerance for slippage. However, it is recognized that at some point, the benefits of such overlap decrease in that the number of tracks required to achieved the desired resolution begins to approach the number of tracks required for a direct read approach of similar resolution.

The examples provided have thus far described the correction of slippage in a left to right direction. It is to be understood that this technique is applicable to slippage in the opposite direction; i.e., counterclockwise rotation of the code disk.

Figure 6:
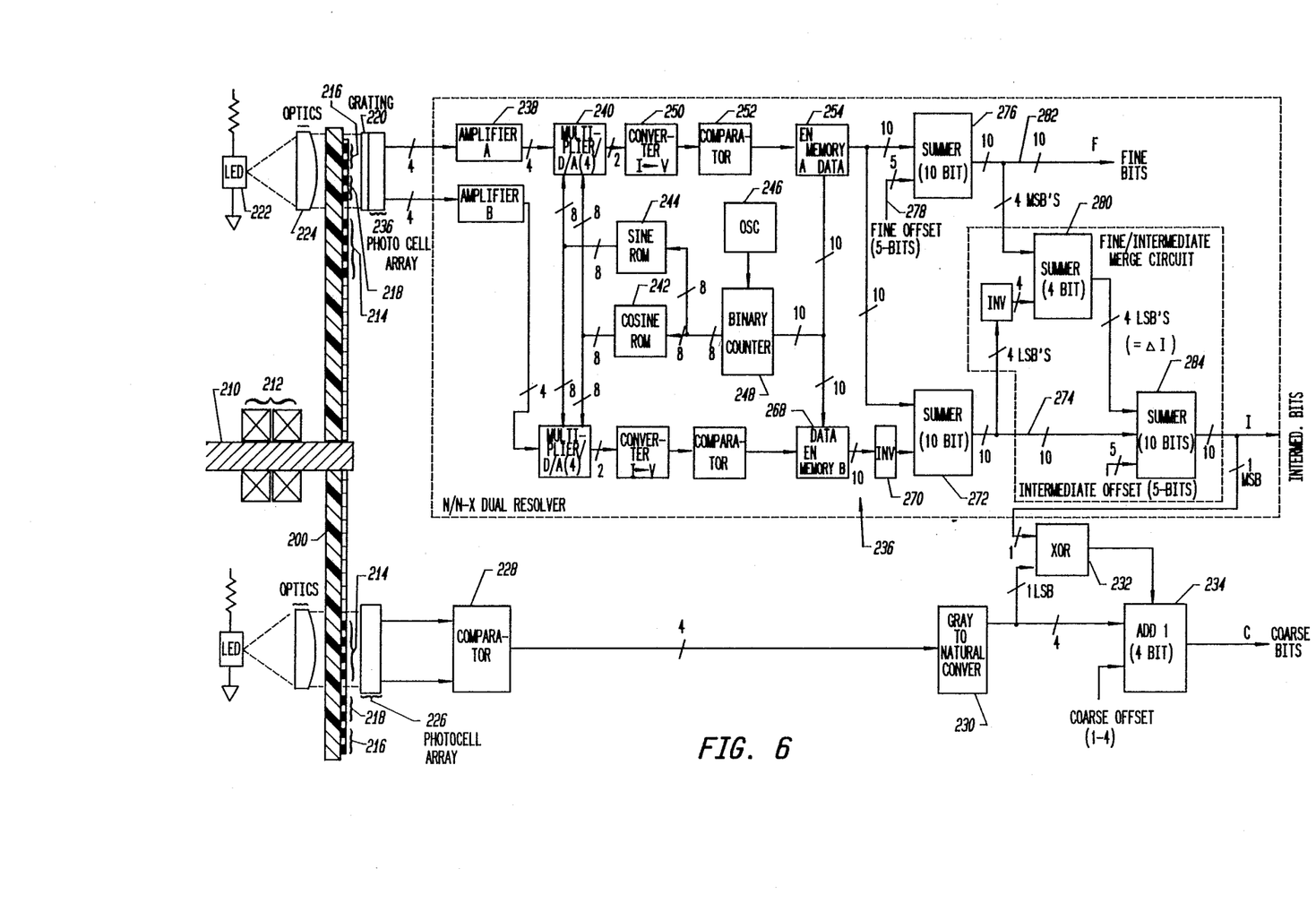
FIG. 6 is a simplified block diagram of an embodiment of the present invention which synthesizes position information from sinusoidal waveforms.
Figure 7A:
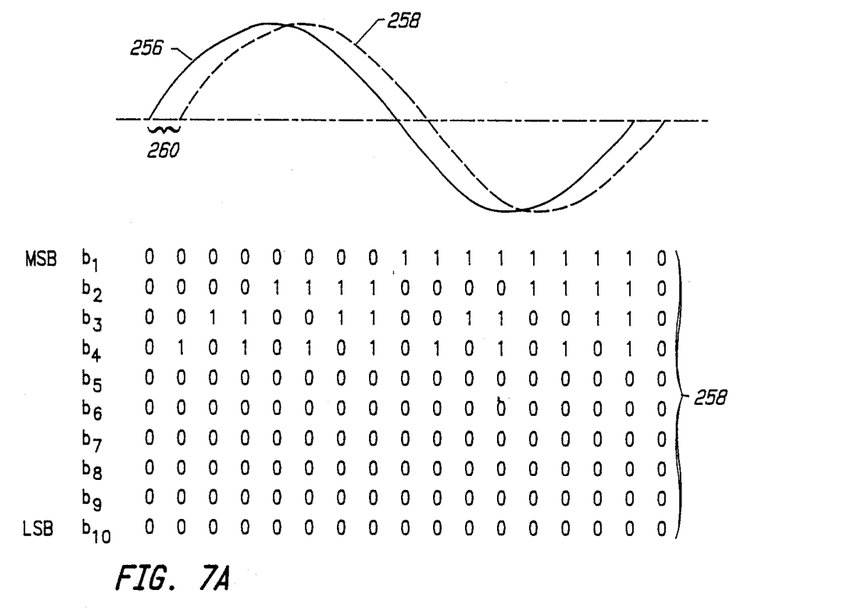
FIGS. 7A and 7B are illustrative examples of the manner in which position information is synthesized from the sinusoidal waveforms by the system of FIG. 6.
Figure 7B:
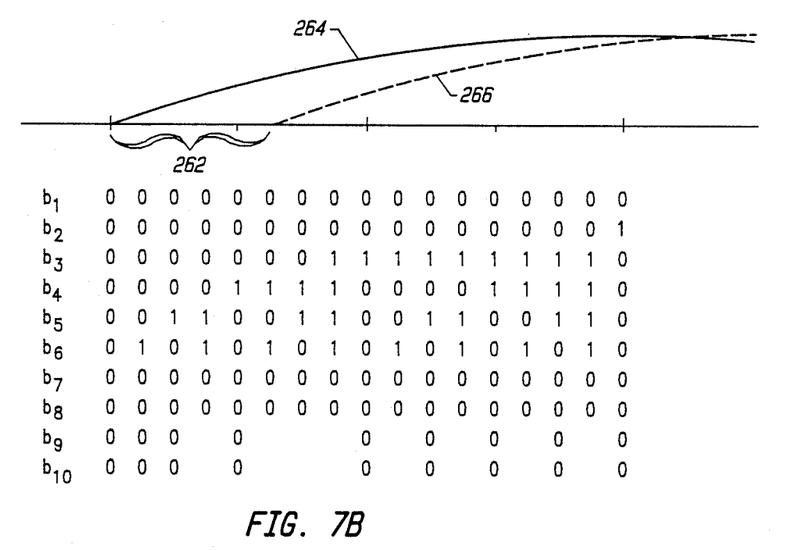

As discussed earlier herein, the position information to be resolved and merged in accordance with the present invention are sets of tracks of indicia which provide sinusoidally varying waveforms. Referring now to FIGS. 6, 7A and 7B, the derivation and merging of position information from sinusoidally varying waveforms will now be discussed in greater detail.

In the embodiment shown in FIG. 6, three tracks of position information are utilized, it being understood that different numbers of tracks and different combinations of tracks can be used within the spirit of the present invention. In the embodiment shown in FIG. 6, code disk 200 is positioned for rotation on shaft 210. Shaft 210 is supported by bearing structures 212. Three sets of tracks are positioned on code disk 200 for the purpose of providing position information for processing: (1) a coarse set of direct-read tracks 214, and (2) two sets of tracks 216 and 218 for generating sinusoidally varying waveforms. These tracks are shown in FIG. 6, in cross section and in exaggerated detail for clarity.

Coarse, direct-read track set 214 is a conventional set of direct-read tracks, and in the embodiment illustrated in FIG. 6, supplies four bits of position information which will be used as the four most significant bits of the output position word. Sets of tracks 216 and 218, in combination with grating 220, modulate light projected on them from light emitting diode 222 and optics 224. Track set 216 provides N sinusoidally varying cycles per revolution of the code disk 220, and track set 218 provides N-X cycles per revolution of the code disk 200.

Light modulated by direct-read tracks 214 is caused to impinge upon photocell array 226. The output of photocell array 226 is applied to comparator 228, which in turn provides a clean, four-bit binary signal. Assuming, for purposes of illustration, that the direct-read track set 214 is in Gray code, the binary data from comparator 228 is then applied to Gray to natural conversion circuit 230 which converts the information into a four-bit natural binary form. Exclusive OR block 232 and add one block 234 provide a conventional one bit merge of the least significant bit of the coarse word with the most significant bit of the word emerging from the resolver circuitry 236. This one bit merge is performed in the conventional form as described in U.S. Pat. No. 3,534,360 to Hafle, referenced hereinabove.

Turning now to track sets 216 and 218, each track set provides four waveforms: cosine, sine, $\overline{\text{cosine}}$ and $\overline{\text{sine}}$. As can be seen from FIG. 6, track set 216 includes two distinct tracks. One of the tracks provides the cosine and sine signals and the other of the tracks provide the $\overline{\text{cosine}}$ and $\overline{\text{sine}}$ signals. To do this, photocell array 236 is configured so that the photocells providing the cosine waveform are positioned in quadrature with the photocells that provide the sine waveform.

For purposes of this explanation, the waveforms from track set 216 will be referred to by an "A" in their argument, while the waveforms from track set 218 will be referred to using a "B" and their argument.

The argument of the waveforms provided by photocell array 236 corresponds to the angular position of the code disk 200, and hence that of the shaft 210.

Position Resolution

The processing of the waveforms for track 216 (the N cycle track) will now be described in detail, it being understood that the processing for the waveforms from track set 218 (the (N-X) cycle track) is essentially the same. The waveforms derived from track set 216 via grating 220 and photocell array 236 are applied to amplifier 238. Amplifier 238 provides gain, phase, and D.C. offset adjustments for conditioning the signal prior to processing. Multiplier/D/A converter 240 performs the dual function of converting the digital words from cosine ROM 242 and sine ROM 244 into analog form, and multiplying these analog forms with the signals received from amplifier 238. This results in the following products and sums:

$$\sin\omega t \cdot \cos A + \cos\omega t \cdot \sin A,$$

and $$\sin\omega t \cdot \cos(A + \pi) + \cos\omega t \cdot \sin(A + \pi),$$

where, $\omega = 2\pi f$, f = frequency in Hertz, and A = spacial angle of the waveform from track set 216.

These result in the identity:

$$\sin(\omega t + A) = \sin\omega t \cdot \cos A + \cos\omega t \cdot \sin A,$$

and $$\overline{\sin(\omega + A)} = \sin\omega t \cdot \cos(A + \pi) + \cos\omega t \cdot \sin(A + \pi),$$

which is the trigonometric identity employed in the above-referenced U.S. Pat. No. 3,534,360 to Hafle.

Hafle taught the use of the identity $$\sin(\omega t + N\Theta) = \sin\omega t \cdot \cos N\Theta + \cos\omega t \cdot \sin N\Theta,$$

where $\omega = 2\pi f$, f = frequency in Hertz, and $\Theta$ = spacial angle, to resolve position information from a sinusoidal waveform.

It is to be understood that the waveform sin (ωt+A) and its complement $$\overline{\sin(\omega t + A)}$$

are used in the preferred embodiment of the present invention to reduce D.C. effects. It is also to be understood that the waveforms sin (ωt+A) can be used alone with satisfactory results.

Examining the above identities in more detail, it can be seen that the sin ωt and cos ωt waveforms originate from cosine ROM 242 and sine ROM 244, respectively, and are the waveforms which are converted into analog form by multiplier/D/A circuit 240. The frequency of the sin ωwt and cos ωwt waveforms is set by oscillator 246, binary counter 248, and the resolution with which the sine and cosine waveforms are digitized in cosine ROM 242 and sine ROM 244.

Oscillator 246 provides a clock, at a fixed frequency, to binary counter 248. Binary counter 248 counts the clock signal and provides an 8-bit address in common to cosine ROM 242 and sine ROM 444. Assuming that $2^8$ a words are provided to synthesize a cycle of the sin ωt or cos ωt waveforms, the frequency of these waveforms correspond to the oscillator frequency divided by $2^8$.

From the identity above, it can be seen that the angular position information A is expressed in terms of the phase angle of a sinusoidally varying waveform having angular frequency ωt. Thus, the angular position information can be extracted from the waveform by an appropriate detection scheme, such as phase detection or the like.

Multiplier/D/A circuitry 240 provides the sin (ωt+A) and the $$\overline{\sin(\omega t + A)}$$

waveforms to converter circuit 250. Converter circuit 250 performs a current to voltage conversion and utilizes the two waveforms to minimize the D.C. offset component. The converted voltage waveform from converter 250 is provided to comparator 252 which provides an output signal indicative of the occurrence of a zero crossing in the waveform applied to it. This zero crossing signal is applied to enable memory block 254. Memory block 254 receives data from binary counter 248 and stores the data present when the enable signal is received from comparator 252, i.e., whenever a zero crossing is detected in the waveform from converter 250. This results in the storing of a digital word in memory 254 which is indicative of the angular position information A.

Referring now to FIGS. 7A and 7B, the manner in which such derivation occurs will be explained in greater detail. FIG. 7A and 7B illustrate the synthesis of a sinusoidally varying waveform 256 from 10-bit digital words 258. Recall that the 10-bit digital words 258 are provided by binary counter 248, which in turn is counting the clock from oscillator 246. The 10-bit digital words 258 address ROMs 242 and 244. Recall also that it is assumed that $2^{10}$ binary words are stored in each of the cosine ROM 242 and sine ROM 244, each such stored word representing the magnitude of the waveform at a particular point in the cycle.

The words shown in FIG. 7A are words occurring at regular intervals which have been selected for purposes of illustration, it being understood that there are many more words in-between the words shown which are used to synthesize the waveform 256. These words are positioned in alignment with the point in the waveform 256 that they define.

The dashed waveform 258 represents the waveform 256 shifted in phase by the amount "A" recall that the amount "A" corresponds to the angular displacement of the shaft being monitored. Waveform 256 has the form sin ωt, while waveform 258 has the form sin (ωt+A). This phase shift is indicated by reference number 260.

Assuming that the zero crossing in waveform 256, from negative to positive, corresponds to a binary counter count of all zeros, it can be seen that the count from binary counter 248, which is in existence at the time a negative-to-positive zero crossing occurs in phase shifted waveform 258, is a direct indication of the amount of phase shift 260.

Assuming $2^{10}$ words are used to synthesize a single cycle of the waveform, each word provided by binary counter 248 represents 360 degrees divided by $2^{10}$.

FIG. 7B illustrates a different phase shift 262 between a synthesized waveform 264 and the phase shifted waveform 266.

In operation, then, binary counter 248 counts the clock from oscillator 246 and provides a 10-bit sequential word to sine ROM 244 and cosine ROM 242 as an address. Cosine ROM 242, in response to the 10-bit address from binary counter 248, provides an 8-bit word indicative of the magnitude of the cosine waveform for that point in the sequence of addresses. Concurrently, sine ROM 244 provides an 8-bit word indicative of the magnitude of a sine waveform for that point in the sequence of addresses. These two words are applied to multiplier/D/A converter 240 where they are converted into analog form and then multiplied by the sine A, cosine A, $$\overline{\sin e\,A}\,,$$

and $$\overline{\cos ine\,A}$$

signals from amplifier 238, and then combined, to obtain the phase shifted sinusoidal waveform having a phase component indicative of the angular position of code disk 200.

In the preferred embodiment of the present invention, track set 216 has a higher number of cycles per revolution of the code disk than does track set 218. As mentioned briefly hereinabove, track set 216 has N cycles per revolution and track set 218 has N−X cycles per revolution of code disk 200. The significance of this is that the position information from track set 218 can be used to provide position information having a resolution intermediate that of the coarse track and that from fine track set 216.

From another point of view, the position information from each set of tracks 214 (coarse), 216 (N) and 218 (N−X) is, in effect, a count of the higher resolution position information. For example, the coarse bits provide a count of the number of cycles of a higher resolution intermediate set of waveforms, and the intermediate set of waveforms provide a count of the number of cycles occurring in an even higher resolution set of waveforms. Finally, the highest resolution position information is resolved from a small number of position words.

Where the number of cycles per revolution between tracks differs by X cycles per revolution, and where the highest resolution track provides N cycles per revolution, the waveforms provided by the N cycle per revolution track and the N−X cycle per revolution track will be in phase with one another every N/X cycles. There will be X such in-phase points. These in-phase points thus subdivide the N cycles per revolution of the N cycle waveform into subsets, and thus can be used to identify the lesser significant bits as being associated with a particular one of the X groups of N−X cycles. For example, where X=8 and N=256, there will be 8 in-phase points, and the in-phase points will occur every 32 cycles in the N cycle waveform. This N/(N−X) technique is a way of generating a waveform that will represent a bit or more in a binary word.

The magnitude of X is selected as a function of the resolution of the next coarser (lower resolution) set of position data, and of the amount of overlap (i.e., the amount of correctability) desired between the next coarser set of position data and the current set of position data. For example, if the next lower resolution set (coarser set) has a least significant bit corresponding to 16 cycles per revolution, and if a one bit overlap is desired, X would be selected to provide a most significant bit in the current position data corresponding to the bit of the lower resolution word with which it is to overlap, in this example the sixteen cycles per revolution bit. The effect of the overlap is used to correct the next higher significant bit in the coarser set, i.e., the bit corresponding to $2^3$. As such, X=8, or X=IMSB/2, where IMSB equals the weight of the most significant bit of the current set of position data.

If a two bit overlap with the four-bit coarse track were desired, X would equal 4, and the most significant bit of the current set of position data would correspond to 8 cycles per revolution; i.e., x=4, IMSB=$2^3$.

Conversely, if the coarse word were 6 bits wide, with the least significant bit corresponding to 64 cycles per revolution ($2^6$), and if a two bit overlap were desired, the most significant bit of the current position data would correspond to 32 cycles per revolution ($2^5$) and X would equal 16.

Figure 8:
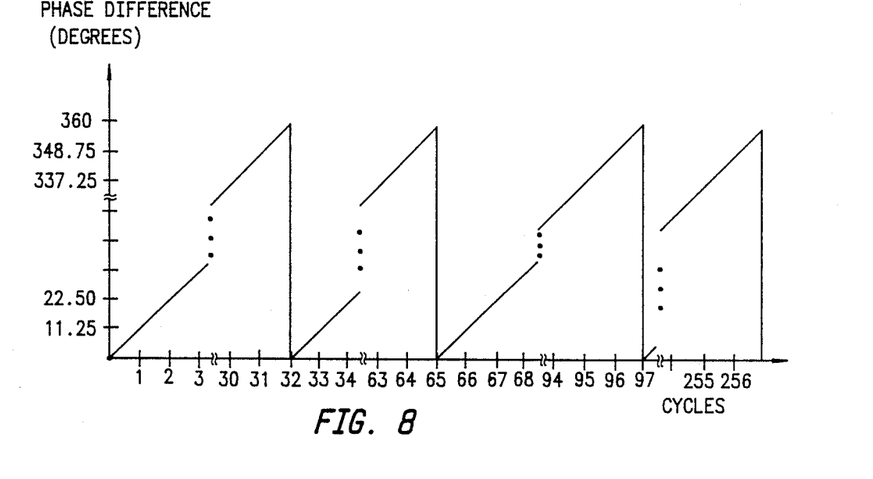
FIG. 8 illustrates the variation of the phase difference between a $\sin(\omega t + N\Theta)$ and a $\sin(\omega t + (N-X)\Theta)$ waveform as a function of the cycles of the $\sin(\omega t + N\Theta)$ waveform.

In accordance with the present invention as embodied in FIG. 6, taking the difference between the two track sets $$\sin(\omega t + N\Theta) - \sin(\omega t + (N-X)\Theta)$$

yields an intermediate set of position data which can be merged with other sets of data. Referring to FIG. 8, this will be explained in greater detail.

The effect of providing two waveforms, one of which has fewer cycles per revolution of the code disk 200 by a selected amount, is to provide a phase difference between them which increases from zero degrees to 360 degrees in each "subdivision." This can be seen in FIG. 8.

FIG. 8 illustrates the difference in phase between the N cycle waveform and the N−X cycle waveform, in degrees, assuming that N=256 and X=8. As can be seen, there are eight subdivisions of 32 cycles apiece given this selection of parameters. In each subdivision, the phase difference starts at zero during the first cycle of the subdivision and increases to 360 degrees at the 32nd cycle of the subdivision.

Figure 9:
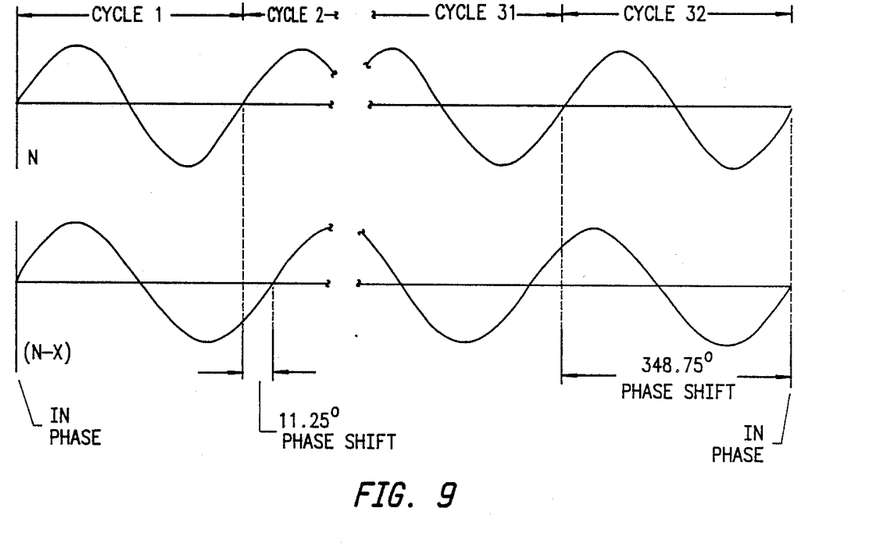
FIG. 9 is an alternative illustration of the variation of the phase difference referred to in FIG. 8.

FIG. 9 is another illustration of this effect—compare selected cycles of the N cycle waveform and the N−X cycle waveform from one of the subdivisions. The phase relationship between the N and N−X cycle waveforms are drawn in exaggerated detail for purposes of illustration. Comparing cycle 1 of the N cycle waveform with cycle 1 of N−X cycle waveform, it can be seen that N−X cycle waveform lags the N cycle waveform by 11.25 degrees. Although not shown, cycle 2 of the N−X cycle waveform will lag cycle 2 of the N cycle waveform by 22.50 degrees. With each additional cycle, the amount of phase lag will increase by 11.25 degrees until in cycle 31, N−X cycle waveform will lag the N cycle waveform by 348.75 degrees. Finally, in cycle 32, the lag will be 360 degrees; i.e., the waveforms will be in phase at the zero crossing.

In light of the above, it should be appreciated that the phase difference between word N and word N−X can provide position information of high resolution. Thus, returning to FIG. 6, the position data stored in memory 254 (N word) is subtracted from the position data stored in memory 268 (N−X word). The position data stored in memory 268 is the phase information derived from track set 218. This will be the phase information corresponding to word N−X.

The subtraction is done in 2's complement form. More specifically, the 10-bit word from memory 254 is summed with the inverted 10-bit word from memory 268. Inverter 270 performs an inversion of the 10-bit word from memory 268. Summer circuit 272 performs the summation of the two words. Not shown in summer 272 is an add 1 operation to the least significant bit of the sum, which completes the 2's complement subtraction. The result of the subtraction is provided from summer 272 onto line 274. Thus, line 274 provides digital information which is indicative of the phase difference between waveform N and waveform N−X.

Returning to memory 254, the position information provided thereby is used as the fine bits for the output position word. Summer 276 permits the adjustment of this word by way of offset bits applied on line 278. The output of summer 276 is provided as the fine bits output, and also the four most significant bits thereof are applied to summer 280. Summer 280 is employed in a 2's complement subtraction operation to subtract the four most significant bits of the output of summer 276 from the four least significant bits from the output of summer 272. This subtraction is part of the merging of the position data on line 274 with the position data on line 282 (from the output of summer 276).

The four least significant bits of the output of summer 280 are added to the position data on line 274 t correct the position data and synchronize the position data with that of the fine bits. Summer 284 performs such addition and then provides at its output corrected intermediate bits.

As discussed earlier herein, the most significant bit of the corrected intermediate bits is used to merge the resolved data with the data from the direct-read track set 214, to provide a coarse set of bits. The coarse bits, intermediate bits and fine bits together provide the bits which form the final position word from the encoder in accordance with the present invention.

As an example, let the coarse track set 214 of FIG. 6 be a four-bit direct-read set of tracks; let track set 216 be a pair of sinusoidal tracks having 256 cycles per revolution of the code track, and let track set 218 have 8 fewer cycles per revolution, i.e., 248 cycles per revolution of the code disk 200. With this configuration, a 17-bit word can be formed as follows:

```
COARSE ——>1 2 3 4     9 10 11 12 13 14 15 16 17 <—— FINE
              4 5 6 7 8 9 10 11 12 13 <—— INTERMEDIATE.
```

Assume that each of the sinusoidal track sets 216 and 218 can provide 10-bit binary position words. The coarse position information is provided by directly reading the tracks in track set 214, as corrected by the overlap between the coarse words and the intermediate words. The intermediate words are derived from the difference in position words between track set 216 and 218. The fine position words are resolved from track set 216. There is an overlap of 5-bits between the fine word and the intermediate word, involving the five most significant bits of the fine word and the five least significant bits of the intermediate word.

The configuration of FIG. 6 has the advantage that the position words used to form the eventual position words are derived from nearly identical signals sources with a common grating. As such, this should reduce errors from external sources, as compared with conventional position encoding methods. The merging circuitry decreases the probability of catastrophe failure in the merged circuit by nearly a factor of 2.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An apparatus for indicating the angular position of an object relative to a reference position of the type having indicia-supporting media positioned for movement with the object, a light source which provides light of a predetermined intensity, and a light detector aligned with respect to the light source to form an optical path through which the indicia supporting media passes, the apparatus further comprising
    a plurality of different tracks of indicia positioned on the indicia-supporting media, wherein each track of indicia includes a different predetermined number of repetitions of a pattern of light-transmitting and light-blocking segments and further including at least a pair of modulation tracks of indicia which provide modulation of the intensity of the light propagating along the optical path from which position words can be synthesized;
    means for synthesizing position information from the modulation tracks of indicia, wherein the resolution of the synthesized position information is greater than the resolution available by reading each selected different track of indicia directly, including
        means for forming intermediate resolution words using the position information from the modulation tracks, wherein said intermediate resolution words have a resolution different from the resolution of the position information from the modulation tracks; and
    means for synchronizing the position information from selected ones of the plurality of different tracks and the intermediate resolution words, including
        means for comparing a plurality of most significant bits of the position information from several of the selected tracks and the intermediate resolution words with a corresponding number of least significant bits of the position information from others of the selected tracks; and
        means for correcting the position information of the selected tracks and the intermediate resolution words as a function of said comparison; and
        means for combining the corrected position information and corrected intermediate resolution words to form overall position words which are indicative of the position of the object relative to the reference position, and which overall position words have a resolution greater than that available by reading the plurality of different tracks of indicia directly.

2. The apparatus of claim 1, wherein the modulation tracks are sinusoidal modulation tracks which provide sinusoidal modulation of the intensity of the light traveling along the optical path, and further wherein the position information synthesizing means include
    means operating upon the modulated light intensity from each of the sinusoidal modulation tracks for forming an alternating signal having a phase which varies as a function of the position of the object;
    means for measuring the phase of the alternating signal and for providing position information which is indicative of the measured phase; and
    means for subtracting the corresponding position information from a pair of the sinusoidal modulation tracks to form the uncorrected intermediate resolution words.

3. The apparatus of claim 1, wherein the modulation tracks are sinusoidal modulation tracks which provide sinusoidal modulation of the intensity of the light traveling along the optical path, and further wherein the synthesizing means include
    means for multiplying the light detector signals with sinusoidally varying signals of predetermined angular frequency to form product terms;
    means for combining the product terms to form a phase-modulated, sinusoidal-like signal having an angular frequency equal to the predetermined angular frequency and a phase component which is a function of the angular position of the object; and
    means for extracting the phase component from the phase-modulated, sinusoidal-like signal to form the position information of predetermined resolution for each sinusoidal modulation track.

4. The apparatus of claim 3, wherein the position information is in the form of position words, and further wherein the forming means include
    means for subtracting position words from a pair of the sinusoidal modulation tracks to form the intermediate resolution words.

5. The apparatus of claim 4, wherein the comparing means compares a plurality of most significant bits from the position words from one of the pair of the sinusoidal modulation tracks with a corresponding number of least significant bits from the intermediate resolution words by determining the difference between the compared bits; and further wherein the correcting means corrects the intermediate resolution words as a function of the determined difference.

6. The apparatus of claim 5, wherein the determined difference is summed with the intermediate resolution words to merge the intermediate resolution words with the position words from one of the pair of sinusoidal modulation tracks.

7. The apparatus of claim 6, wherein the pair of sinusoidal modulation tracks include a track with a first resolution and a track with a second resolution, higher than the first, and further wherein the intermediate resolution words are merged with the position words from the sinusoidal tracks having the second higher resolution.

8. A method for indicating the angular position of an object relative to a reference position of the type having indicia-supporting media positioned for movement with the object, comprising the steps of synthesizing position information from selected tracks of a plurality of different tracks of indicia, wherein the plurality of different tracks of indicia are positioned on the indicia-supporting media, and each track of indicia includes a different predetermined number of repetitions of a pattern of light-transmitting and light-blocking segments, and further wherein the resolution of the synthesized position information is greater than the resolution available by reading each selected different track of indicia directly, wherein the step of synthesizing position information includes the steps of forming an intermediate set of position words by subtracting position words from tracks which differ from one another in cycles per revolution by a predetermined amount; and merging the intermediate position words with the position words from one of the tracks used to form the intermediate words;

synchronizing the position information from each of the plurality of different tracks and the intermediate position words with one another, including the steps of comparing a plurality of most significant bits of the position information from several of the selected tracks with a corresponding number of least significant bits of the position information from others of the selected tracks; and correcting the position information of the selected tracks and the intermediate position words as a function of said comparison; and combining the synchronized position information to form position words indicative of the position of the object relative to the reference position, which position words have a resolution greater than that available by reading the plurality of different tracks of indicia directly.

9. The method of claim 8, further including the steps of forming tracks of indica to provide a pair of sinusoidally varying signals which differ in frequency from one another by a predetermined amount; and synthesizing position words from each of the pair of sinusoidally varying signals for use in forming the intermediate position words.

* * * * *